(12) United States Patent
Shiu et al.

(10) Patent No.: US 7,862,377 B2
(45) Date of Patent: Jan. 4, 2011

(54) USB CONNECTOR AND METHOD OF MANUFACTURE

(75) Inventors: George Shiu, South Pasadena, CA (US); Choon Tak Tang, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 67 days.

(21) Appl. No.: 12/273,514

(22) Filed: Nov. 18, 2008

(65) Prior Publication Data

US 2010/0124847 A1 May 20, 2010

(51) Int. Cl.
*H01R 13/60* (2006.01)

(52) U.S. Cl. .................................. 439/607.35

(58) Field of Classification Search ............ 439/607.19, 439/607.35, 607.01, 79, 173
See application file for complete search history.

(56) References Cited

U.S. PATENT DOCUMENTS

| | | | |
|---|---|---|---|
| 6,257,930 B1 * | 7/2001 | Yu | 439/607.01 |
| 7,004,780 B1 | 2/2006 | Wang | |
| 7,094,074 B2 | 8/2006 | Chiou et al. | |
| 7,297,024 B2 | 11/2007 | Ni et al. | |
| 7,422,454 B1 | 9/2008 | Tang et al. | |
| 2005/0181645 A1 * | 8/2005 | Ni et al. | 439/79 |
| 2007/0070611 A1 | 3/2007 | Koh | |
| 2008/0045056 A1 * | 2/2008 | Collantes et al. | 439/131 |
| 2008/0153350 A1 | 6/2008 | Dei Rossi et al. | |
| 2008/0233776 A1 | 9/2008 | Tang et al. | |
| 2008/0233798 A1 * | 9/2008 | Yu et al. | 439/607 |
| 2008/0278902 A1 * | 11/2008 | Nguyen et al. | 361/684 |

* cited by examiner

*Primary Examiner*—Alexander Gilman
(74) *Attorney, Agent, or Firm*—Sawyer Law Group, P.C.

(57) ABSTRACT

A special USB connector which can accommodate PCBA with discrete components soldered on the frontal portion of PCBA is disclosed. The components can be positioned inside the USB connector. A carrier is utilized for PCBA support within a special USB connector used for compact USB devices and sliding motion.

16 Claims, 7 Drawing Sheets

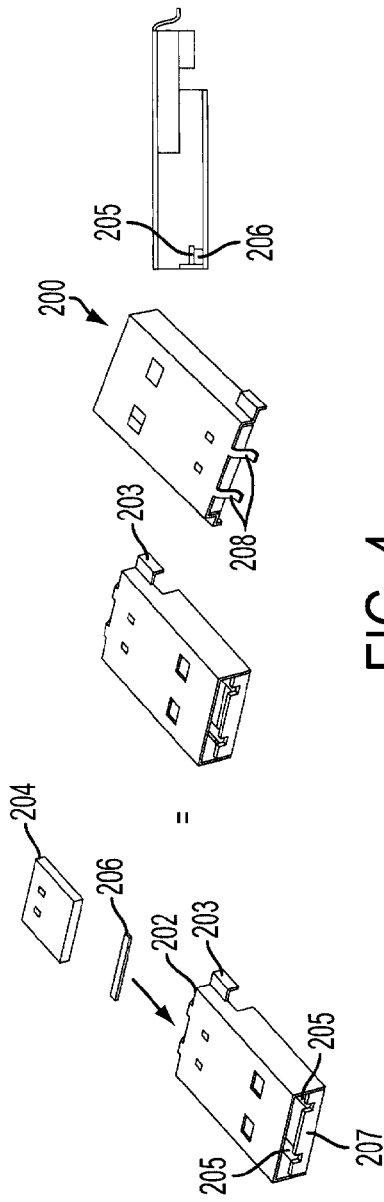
FIG. 4
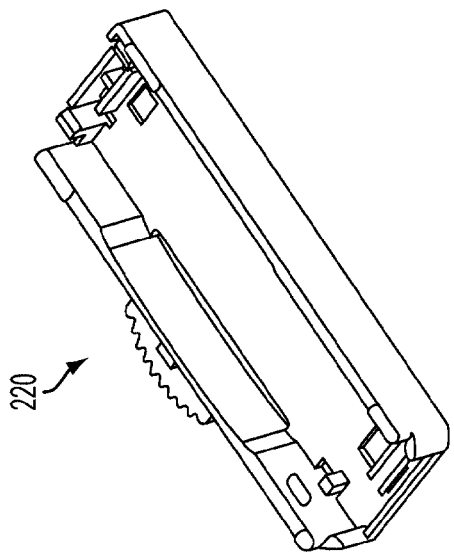
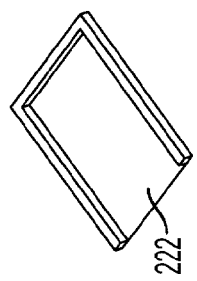
FIG. 5A

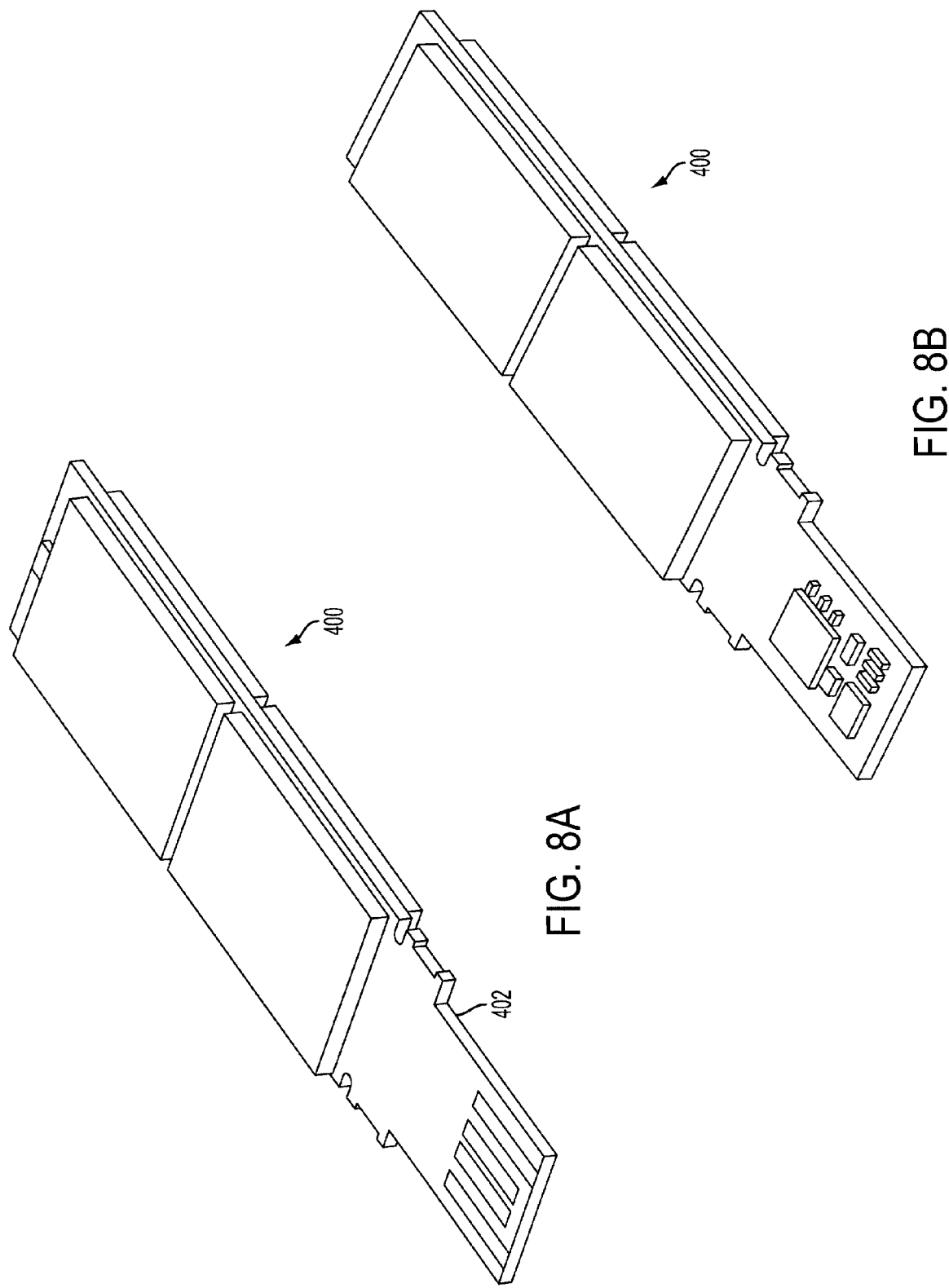

USB CONNECTOR AND METHOD OF MANUFACTURE

FIELD OF THE INVENTION

The present invention relates generally to a USB connector and more specifically to a USB connector which can accommodate a printed circuit board assembly (PCBA).

BACKGROUND OF THE INVENTION

USB connectors are utilized in a variety of environments for connecting devices to computer systems or other types of processing systems. A common USB connector utilizes a printed circuit board, with all core and discrete components soldered onto one or both sides. FIG. 1 is a diagram of a conventional USB connector 10. This type of connector, a standard USB connector 14 with a metal shield 12 is soldered onto the front of the same PCB board. The size of the metal shield is standard, where the opposite side of its 4-contact area 16 contain no components. U.S. Pat. No. 7,297,024, entitled "Universal-Serial-Bus (USB) Flash-Memory Device with Metal Wrap Formed Over Plastic Housing," issued Nov. 20, 2007, describes an elongated USB casing device which is fully either plastic or metal wrapped with no sliding carrier or switching mechanism. The printed circuit board is encapsulated in resin and then placed on a molded plastic casing.

In another example, U.S. Pat. No. 7,094,074, entitled "Manufacturing Methods for Ultra-Slim USB Flash-Memory Card with Supporting Dividers or Underside Ribs," issued Aug. 22, 2006, discloses an ultra slim device without a metal shield. All core and discrete components are soldered on a PC board and then enveloped in a plastic casing composed of top and bottom casing parts. This is not a standard USB connector and so it oftentimes has to be specifically adapted to the computer system.

Another manufactured device without a standard USB connector with a metal shield is disclosed with the core components in an unpackaged die form-factor with an intent to reduce the size. The PC board substrate is composed of such dies and discrete components soldered onto the PC board encapsulated in resin finishing. Then the device is covered by an external plastic casing.

The absence of a USB connector with metal shield causes high wear-out durability and quality issues. Also, if the device is too long, it will not be as rigid and sturdy. When the plastic is used for casing, and the device is inserted and extracted repeatedly by the user into the female USB port, there is increased wear. This results in loosened or weakened insertion when the thickness of the plastic of the device wears out.

In addition, with all of these prior art systems, there is a need for some kind of encapsulation process, such as resin encapsulation or the like, which is utilized to protect the part. This resin encapsulation costs money and requires longer manufacturing time and there are still reliability and quality issues.

Accordingly, what is needed is a system and method that overcomes the above-identified issues. The system should be cost-effective, easily adaptable, minimizing the length of the device, and utilized with USB-connector type systems. The present invention addresses such a need.

SUMMARY OF THE INVENTION

A special USB connector which can accommodate PCBA with discrete components soldered on the frontal portion of PCBA is disclosed. The components can be positioned inside the USB connector. A carrier is utilized for PCBA support within a special USB connector used for compact USB devices and sliding motion.

BRIEF DESCRIPTION OF THE DRAWINGS

FIG. 4 illustrates a second embodiment of a USB connector in accordance with the present invention.

FIG. 5A illustrates a carrier for containing the USB connector of FIG. 4.

FIG. 8A is a top view of the printed circuit board with 4-contacts.

FIG. 8B is a bottom view of the printed circuit board.

DETAILED DESCRIPTION

The present invention relates generally to a special USB connector and more specifically to a USB connector which can accommodate a printed circuit board assembly (PCBA). The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A USB connector in accordance with the present invention can house a printed circuit board assembly (PCBA) with four metal contacts on one side, and discrete components on the other side of the PCB. This PCBA extends all the way to the front of the connector, where its frontal edge rests on the connector's frontal support(s).

Figure 1:
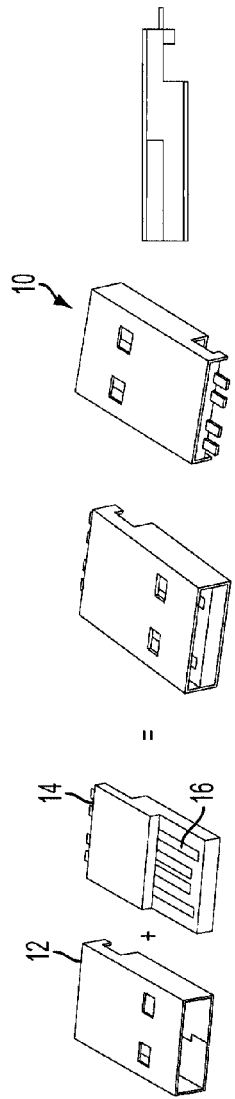
FIG. 1 illustrates a conventional USB connector.
Figure 2:
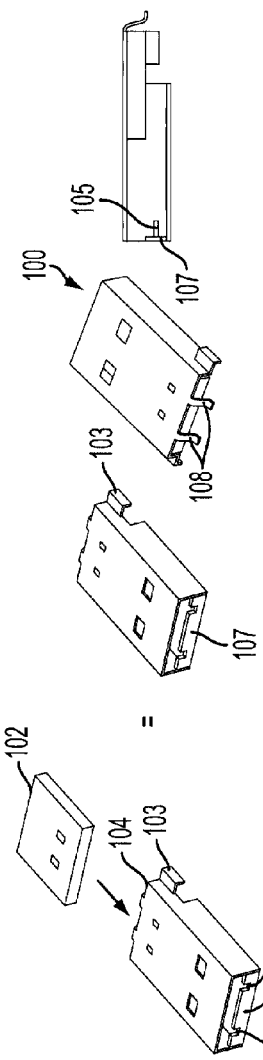
FIG. 2 illustrates a first embodiment of the USB connector in accordance with the present invention.

FIG. 2 illustrates a first embodiment of the USB connector 100 in accordance with the present invention. This embodiment of the USB connector 100 has two bends 105 made at the front panel 107 of the metal shield 104 to support the PCBA to be inserted. In FIG. 2, the connector 100 includes a top-rear support 102 which is inserted into the metal shield 104. The metal shield 104 includes metal prongs 103 to be inserted into a printed circuit board (not shown).

Figure 3:
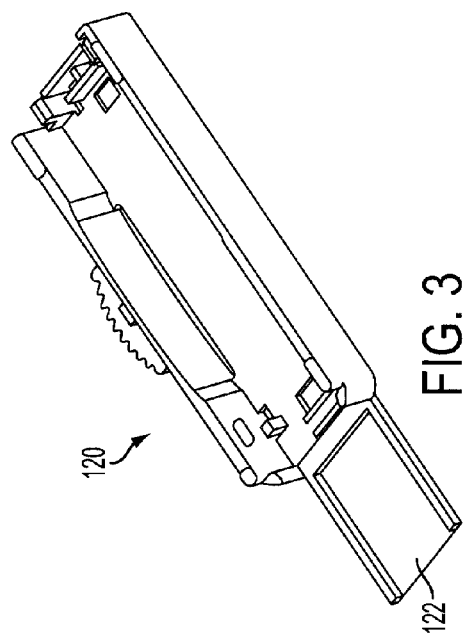
FIG. 3 illustrates a carrier for containing the USB connector of FIG. 2.

FIG. 3 illustrates a carrier 120 for containing the USB connector of FIG. 2. Carrier 120 is utilized to insert the connector 100 into a computer or some other electronic device. Bottom-rear plastic PCBA support 122 is built as part of the front portion of the carrier 120. It is deployed by being inserted into the rear of the special USB connector 100, on the discrete components' side (bottom side) of the PCBA.

Figure 5B:
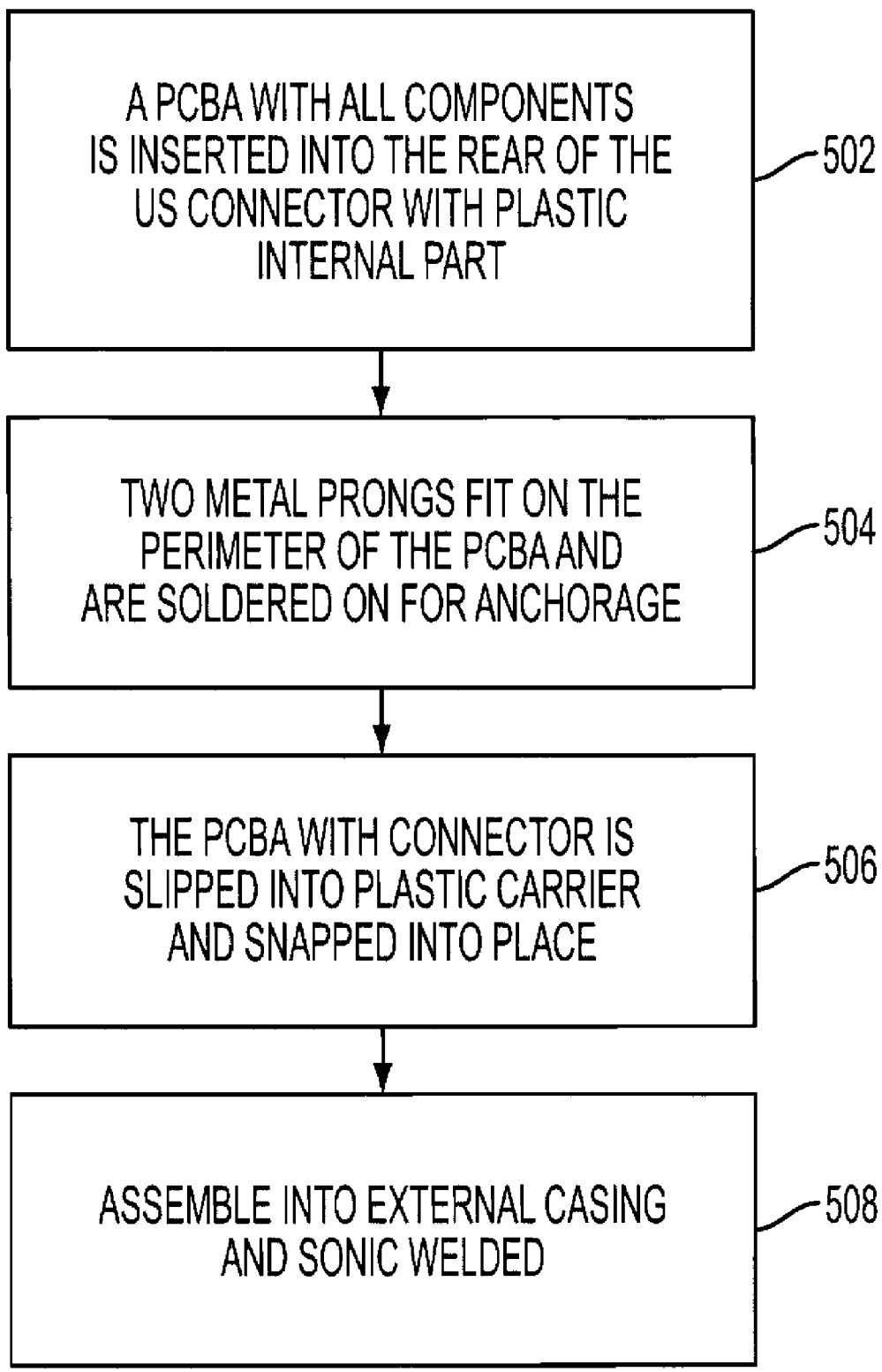
FIG. 5B is a flow chart containing the assembly process of the USB connector of FIG. 4.

FIG. 4 illustrates a second embodiment of a USB connector 200 in accordance with the present invention. In FIG. 4, the connector 200 is similar to connector 100 of FIG. 2, except there is a plastic rib 206 therein that is utilized with top-rear support 204. Both the plastic rib 206 and the top-rear support 204 are inserted into the metal shield 202. The embodiment of the USB connector 200 has plastic rib 206 attached to the metal shield 202 inside the frontal edge of the USB connector's metal shield 202 to augment the two bends 205 in front panel 207 for PCBA support. FIG. 5A illustrates a carrier 220 for containing the USB connector 200 of FIG. 4, and a bottom-rear support 222. Carrier 220 is utilized to insert the connector 200 into a device.

Referring to FIGS. 2 and 4, the metal tabs 108, 208, and the two metal prongs 103, 203 that attach to the perimeter of the PCB crimped at predetermined positions by a 90-degree angle, are then soldered on the PCB.

The process of assembly of the connectors 100 and 200 is described in conjunction with flow chart 5B. First, a PCBA with all components is inserted into the rear of the USB connector with plastic internal part, via step 502. Next, two metal prongs are fit on the perimeter of the PCBA and are soldered on for anchorage, via step 504. Then, the PCBA with the USB connector is slipped into the plastic PCBA carrier and snapped in place, via step 506. Then, the assembly is placed into an external casing and sonic welded, via step 508.

Figure 6:
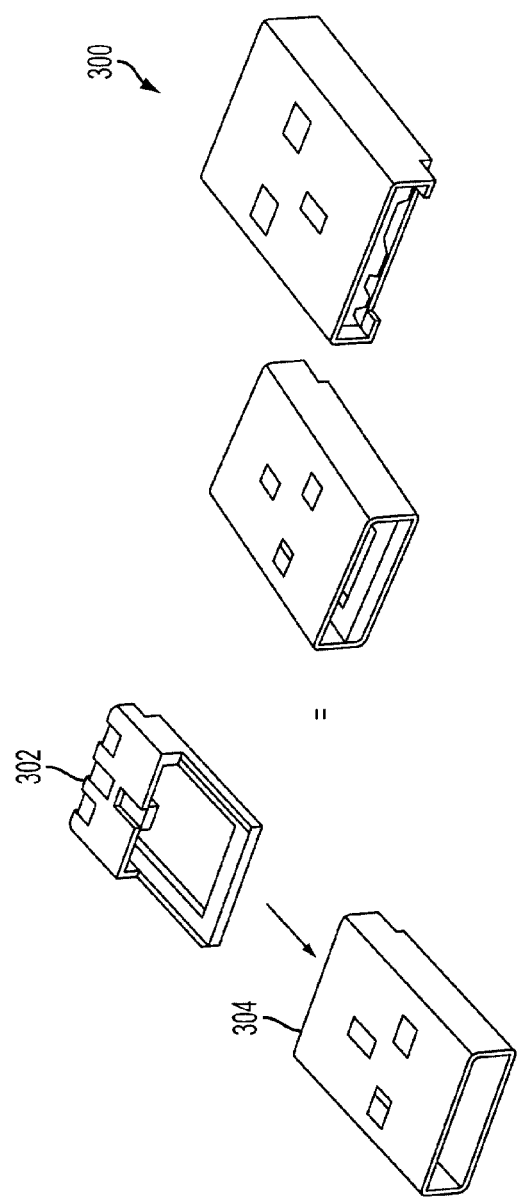
FIG. 6 illustrates a third embodiment of a USB connector in accordance with the present invention.
Figure 7A:
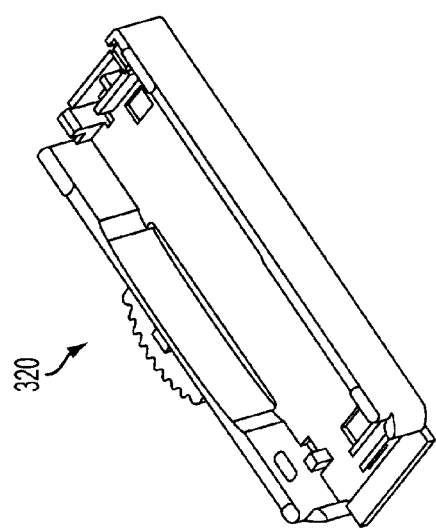
FIG. 7A illustrates a carrier for the USB connector of FIG. 6.

FIG. 6 illustrates a third embodiment of a USB connector in accordance with the present invention. Referring to FIG. 6, a USB connector 300 is manufactured with a special plastic internal part 302 and an installation housing 304 that houses the PCBA with core components placed behind the USB connector 300, and discrete components are soldered on the frontal portion of the PCBA which is inserted into the rear of the USB connector 300. FIG. 7A illustrates a carrier 320 for the USB connector 300 of FIG. 6.

Figure 7B:
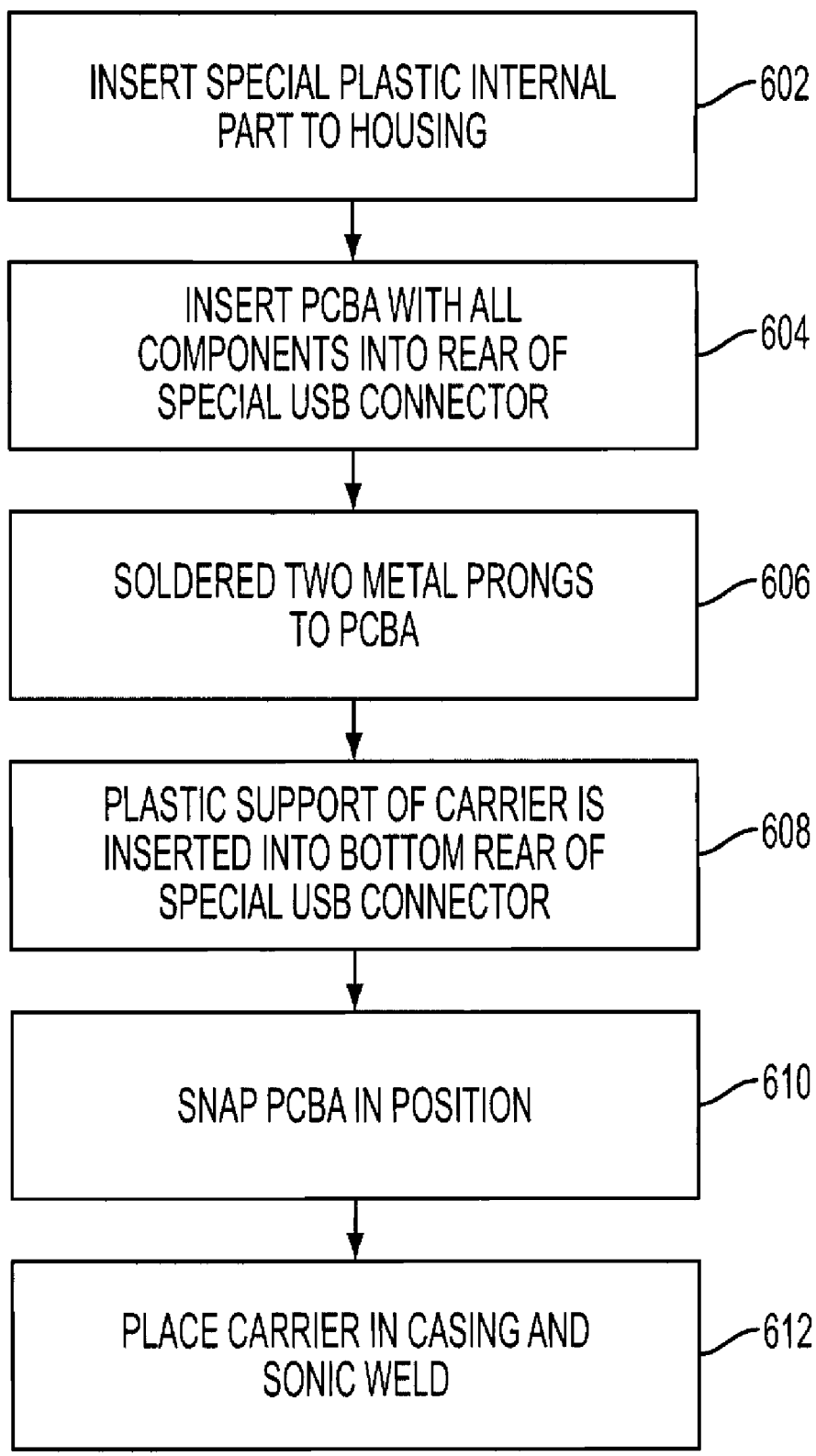
FIG. 7B is a flow chart containing the assembly process of the USB connector of FIG. 6.

The assembly process is as follows, in accordance with a flow chart shown in FIG. 7B. First, insert Special Plastic Internal part 302 to housing 304, via step 602. Next, insert PCBA with all components into rear of special USB connector, via step 604. Then, two metal prongs are soldered on to the PCBA via step 606. Then, a plastic support carrier is inserted into bottom rear of USB connector, via step 608. The PCBA is snapped into position, via step 610. Finally, the assembly is then placed into an external casing and then is sonic-welded to complete the assembly, via step 612.

The operation of the connectors 100, 200 and 300 of FIGS. 2, 4 and 6, respectively when inserted in the carrier 120, 220 and 320 of FIGS. 3, 5A and 7A respectively could be similar to, for example, that described in, "Retractable Memory Drive," U.S. Pat. No. 7,422,454, which describes memory drives such as drives with USB connectors which are frequently utilized to portably transfer electronic data which is assigned to the assignee of the present application, and which is incorporated by reference in its entirety herein.

A retractable memory drive in accordance with the present invention comprises a top casing, a middle carrier, an electronic device such as a USB thumb drive, and a bottom casing. A positioning device on the middle carrier has a portion that protrudes outside the casing and operates like a button. The location of the positioning device where the button is located has two key attributes. First, there is a protrusion that acts as a lock with the casing. Second, the area below the button is not rigid and so it gives way when pressure is applied to the button.

The top and bottom casings provide a casing structure which includes two detents. One detent is for locking the device with the connector in the extended position, and one detent for locking the device with the connector in the "in" position. This allows for just one press of the extended portion of the positioning device to unlock it from its present position. When the device reaches its new position it will automatically lock. There are also guide rails that allow the middle carrier to remain in an appropriate position.

FIG. 8A is a top view of the printed circuit board 400. The front part 402 of the PCB 400 includes four metal contact pins on the top side. Front part 402 is inserted into the special USB connector (see FIG. 9).

FIG. 8B is a bottom view of the printed circuit board 400. Discrete components are shown on the bottom side of the PCB on the front part 402, under the four contact pins on the top side of the PCB 400.

Figure 9:
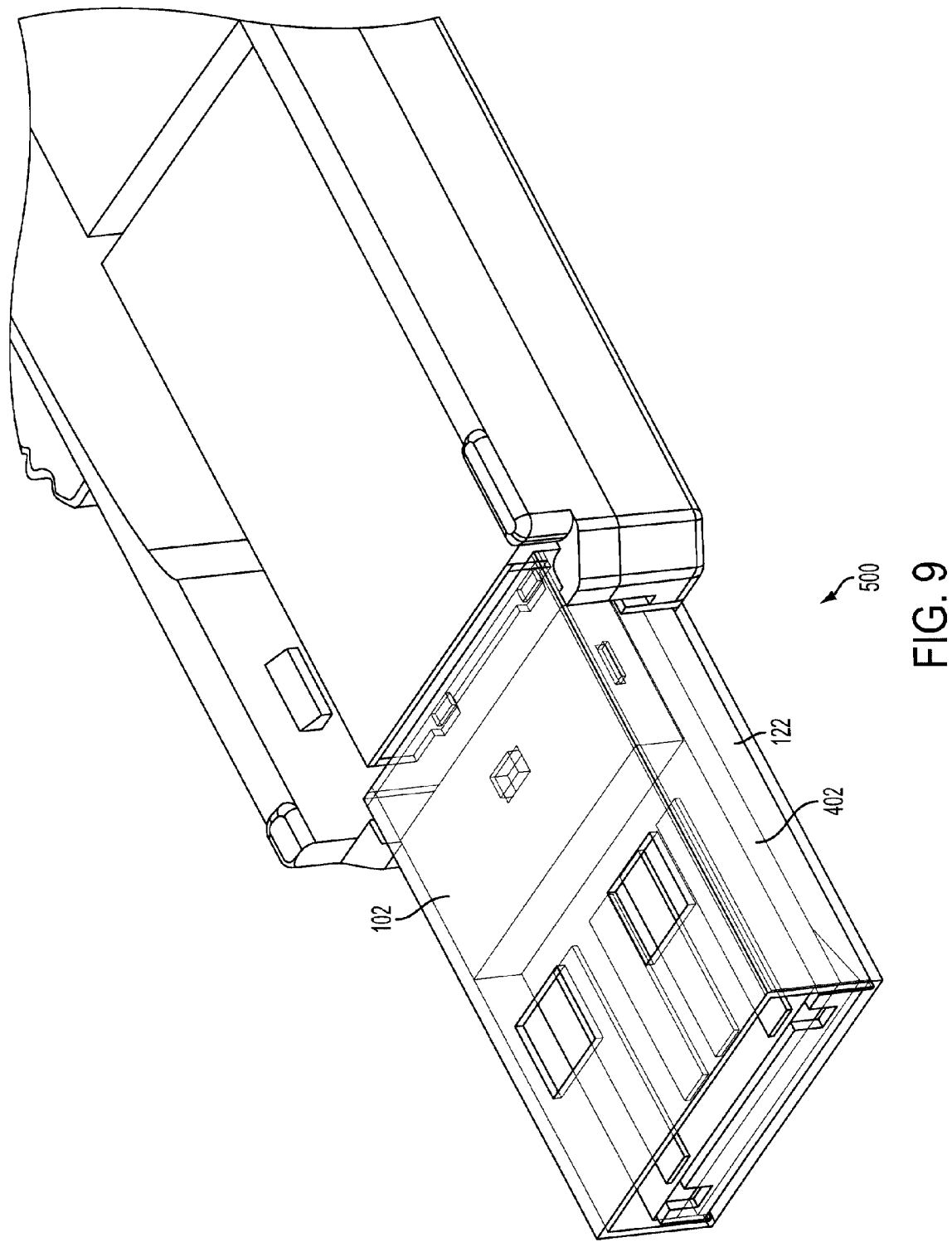
FIG. 9 is a view of the USB connector in combination with the printed circuit board.

FIG. 9 is a view of the USB connector 500 in combination with the printed circuit board 400. Referring to FIG. 9, the positions of a special plastic PCBA support 122, which is the front part of carrier 120, and plastic PCBA support 102 gives the PCBA support and protects the discrete components placed on the PCB (on the frontal part 402 of the PCB, under the 4 contact-pins).

Advantages

The special USB connector, along with sliding carrier mechanism for higher reliability and quality of device, allows for the following advantages.

1. The use of a specially designed USB connector with metal shield that improves and enhances operation with regard to Electromagnetic Interference (EMI) and Electrostatic discharge (ESD) of the present invention. The metal shield enables the placement of discrete components under the USB connector's four contact pins in a protected way. Strong PCBA support is now achieved by the metallic frontal supports and plastic support blocks placed within the metal shield.

2. The use of a PCBA carrier will not only provide a sliding lock mechanism, but also provide for frontal PCBA support and protection for discrete components placed on the PC Board on the side of the PCBA under the USB connector's four contact pins. Such a feature simply strengthens the device's insertion area, and increases durability and quality of the device.

Although the present invention has been described in accordance with the embodiments shown, one of ordinary skill in the art will readily recognize that there could be variations to the embodiments and those variations would be within the spirit and scope of the present invention. Accordingly, although the present invention is disclosed in conjunction with a USB connector one of ordinary skill in the art readily recognizes that the present invention could be utilized with a variety of connectors and that use would be within the spirit and scope of the present invention. Accordingly, many modifications may be made by one of ordinary skill in the art without departing from the spirit and scope of the appended claims.

What is claimed is:

1. A USB connector comprising:

a metal shield for holding at least a portion of a printed circuit board having a plurality of connector contacts on a top side of the at least a portion of the printed circuit board and having discrete components on a bottom side of the at least a portion of the printed circuit board opposite to the connector contacts, the printed circuit board extending to a front edge of the metal shield and the discrete components being protected by the metal shield, the metal shield including prongs which are attachable to the printed circuit board; and a top support separate from the printed circuit board and provided within the metal shield above the at least a portion of the printed circuit board, the top support supporting the top side of the printed circuit board.

2. The USB connector of claim 1 wherein the prongs are attachable to the printed circuit board at the perimeter of the printed circuit board.

3. The USB connector of claim 1 further comprising a carrier that holds the printed circuit board.

4. The USB connector of claim 1 wherein the metal shield includes at least one bend at the front edge of the metal shield, the at least one bend being at least one bent portion of the front edge and supporting the bottom side of the at least a portion of the printed circuit board.

5. The USB connector of claim 4 further comprising a plastic rib provided in the metal shield under the at least one bend the elastic rib providing additional frontal support for the bottom side of the at least a portion of the printed circuit board.

6. The USB connector of claim 1 further comprising a bottom support provided in the metal shield for supporting the bottom side of the at least a portion of the printed circuit board.

7. The USB connector of claim 6 wherein the bottom support is attached to a carrier that holds the printed circuit board.

8. The USB connector of claim 6 wherein the top support and the bottom support are provided as a single piece internal to the metal shield.

9. The memory drive of claim 6 wherein the bottom support is attached to a carrier that holds the printed circuit board.

10. A memory drive comprising:
    a casing including a carrier portion;
    a printed circuit board within the carrier portion; and
    a USB connector within the carrier portion, the USB connector comprising:
    a metal shield for holding at least a portion of the printed circuit board having a plurality of connector contacts on a top side of the at least a portion of the printed circuit board and having discrete components on a bottom side of the at least a portion of the printed circuit board, the printed circuit board extending to a front edge of the metal shield and the discrete components being protected by the metal shield, the metal shield including metal prongs which are attachable to the printed circuit board; and
    a top support separate from the printed circuit board and provided in the metal shield above the at least a portion of the printed circuit board, the top support supporting the top side of the printed circuit board.

11. The memory drive of claim 10 wherein the prongs are attachable to the printed circuit board at the perimeter of the printed circuit board.

12. The memory drive of claim 10 further comprising a carrier that holds the printed circuit board.

13. The memory drive of claim 10 wherein the metal shield includes at least one bend at the front edge of the metal shield, the at least one bend being at least one bent portion of the front edge and supporting the bottom side of the at least a portion of the printed circuit board.

14. The memory drive of claim 13 further comprising a plastic rib provided in the metal shield under the at least one bend, the plastic rib providing additional frontal support for the bottom side of the at least a portion of the printed circuit board.

15. The memory drive of claim 10 further comprising a bottom support provided in the metal shield for supporting the bottom side of the at least a portion of the printed circuit board.

16. The memory drive of claim 10 wherein the top support and the bottom support are provided as a single piece internal to the metal shield.

* * * * *